US007443209B2

(12) United States Patent
Chang

(10) Patent No.: US 7,443,209 B2
(45) Date of Patent: Oct. 28, 2008

(54) PWM LED REGULATOR WITH SAMPLE AND HOLD

(75) Inventor: Chin Chang, Agoura Hills, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 669 days.

(21) Appl. No.: 10/540,671

(22) PCT Filed: Dec. 18, 2003

(86) PCT No.: PCT/IB03/06098

§ 371 (c)(1), (2), (4) Date: Jun. 24, 2005

(87) PCT Pub. No.: WO2004/060023

PCT Pub. Date: Jul. 15, 2004

(65) Prior Publication Data

US 2006/0082397 A1 Apr. 20, 2006

Related U.S. Application Data

(60) Provisional application No. 60/436,858, filed on Dec. 26, 2002.

(51) Int. Cl.
*G11C 27/02* (2006.01)

(52) U.S. Cl. ......................... 327/94; 327/108; 327/109; 315/291; 323/282

(58) Field of Classification Search .................. 327/91, 327/94, 96, 108, 109; 323/282, 259; 315/291, 315/224, 312
See application file for complete search history.

(56) References Cited

U.S. PATENT DOCUMENTS

| | | | | |
|---|---|---|---|---|
| 6,304,464 | B1 * | 10/2001 | Jacobs et al. | 363/21.12 |
| 6,472,957 | B1 | 10/2002 | Dobrovolny | |
| 6,507,159 | B2 * | 1/2003 | Muthu | 315/307 |
| 6,621,235 | B2 * | 9/2003 | Chang | 315/216 |
| 6,734,639 | B2 * | 5/2004 | Chang et al. | 315/291 |
| 6,801,028 | B2 * | 10/2004 | Kernahan et al. | 323/283 |
| 7,274,183 | B1 * | 9/2007 | Gu et al. | 323/288 |

* cited by examiner

*Primary Examiner*—Haissa Philogene

(57) ABSTRACT

Improved stability in a regulator having a sample-and-hold. Coupling an input voltage to an input node of the sample-and-hold circuit is provided. Activating the sample-and hold circuit in response to the input voltage and sensing an output voltage at an output node coupled to the sample and hold circuit is also provided. Determining whether the input voltage at the input node is greater than the output voltage at the output node and providing a sample-and-hold function based on the determination are also provided. A regulation circuit is provided. A sample-and-hold circuit coupled to input and output nodes is also provided. The transfer function of the sample-and-hold circuit is pseudo-all-pass if the input voltage at the input node is greater than an output voltage at the output node and is a substantially constant signal if the input voltage at the input node is less than the output voltage at the output node.

18 Claims, 4 Drawing Sheets

PWM LED REGULATOR WITH SAMPLE AND HOLD

CROSS REFERENCE TO RELATED APPLICATION

This application claims the benefit of U.S. provisional application Ser. No. 60/436,858 Dec. 26, 2002, which is incorporated herein by reference.

FIELD OF THE INVENTION

The invention relates to regulated LED current sources. More particularly the invention relates to techniques for configuring an LED regulator for improved stability.

BACKGROUND OF THE INVENTION

LED lighting systems generally employ regulated power sources for supplying power to the LEDs. In the art of LED drivers, it is known to use a pulse-width modulated (PWM) drive current as a power source to the LED. Generally, a regulator circuit includes several sub-circuits with active and passive elements that operate in concert to provide power regulation.

A simple circuit diagram for a typical regulator for driving LED strings is shown in FIG. 1. A Buck-Boost converter is formed of Q1, L, D1 and C1. A serial LED string is denoted as D5. The OP-AMP1 along with the surrounding resistors, R5, R6, R7, R8 forms a differential amplifier for the sensed current signal form R1. An analog PID controller is formed by OP-AMP2 along with the surrounding components R9, R10, R11, R12, C5, C6, and C7. A PWM signal is introduced to the regulator circuit through the modulator COMP1. In steady-state DC operation, the LED string D5 current is regulated by the regulator circuit.

FIG. 2 illustrates the regulator circuit configured to provide the LED string D5 with light output adjustment or dimming functionality. It is known to be beneficial to use a low-frequency PWM current for the LED string D5 by invoking a series switch Q2 as is depicted in FIG. 2. In order to reduce the current peak pulse in the LED string D5 at each turn on event, a simple sample-and-hold 210 sub-circuit consisting of R2, R4, C2 and D2 is provided. As shown in FIG. 2, the sample-and-hold sub-circuit has an output voltage V3 and an input voltage V6. It can be shown that when the diode D2 conducts, the transfer function of the sample-and-hold 210 sub-circuit is:

$$\frac{V3}{V6} = K(s) = K_0 \frac{1}{1 + \frac{s}{\omega}}, \tag{1}$$

$$\text{where } K_0 = \frac{R2}{R2 + R4}, \text{ and} \tag{2}$$

$$\omega = \frac{R2 + R4}{R2 * R3 * C2}. \tag{3}$$

Inspection of equation (1) reveals that the sample-and-hold introduces a pole, with an associated 90 degree phase delay, into the current regulation loop. The LED regulator phase margin is therefore reduced and the regulator circuit tends to oscillate. It would therefore be desirable to provide an improved LED regulator configuration that addressed these and other limitations.

SUMMARY OF THE INVENTION

The present invention is directed to a system and method for improving stability in an LED regulator. In accordance with the invention a method for configuring a regulator circuit having a sample-and-hold circuit is provided. Coupling an input voltage to an input node of the sample-and-hold circuit is provided. Activating the sample-and hold circuit in response to the input voltage and sensing an output voltage at an output node coupled to the sample and hold circuit is also provided. Determining whether the input voltage at the input node is greater than the output voltage at the output node and providing a sample-and-hold function based on the determination are also provided.

In accordance with another aspect of the invention, a regulator circuit having a sample-and-hold circuit with improved stability is provided. A regulation circuit is provided. A sample-and-hold circuit coupled to input and output nodes is also provided. The transfer function of the sample-and-hold circuit is pseudo-all-pass if the input voltage at the input node is greater than an output voltage at the output node and is a substantially constant signal if the input voltage at the input node is less than the output voltage at the output node.

The foregoing and other features and advantages of the invention are apparent from the following detailed description of exemplary embodiments, read in conjunction with the accompanying drawings. The detailed description and drawings are merely illustrative of the invention rather than limiting, the scope of the invention being defined by the appended claims and equivalents thereof.

In the following description the term "coupled" means either a direct connection between the things that are connected, or a connection through one or more active or passive devices that may or may not be shown, as clarity dictates.

DETAILED DESCRIPTION OF THE PREFERRED EMBODIMENT

Figure 3:
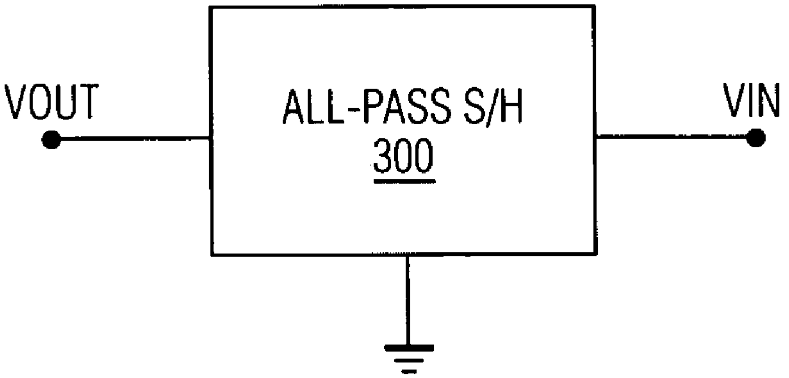
FIG. 3 is a block diagram of an pseudo-all-pass sample-and-hold circuit in accordance with the present invention.

FIG. 3 is a block diagram of a pseudo-all-pass sample-and-hold circuit in accordance with the present invention. FIG. 3 shows a pseudo-all-pass sample-and-hold circuit 300. The pseudo-all-pass sample-and-hold circuit 300 is shown having an input node Vin and an output node Vout both referenced to ground.

The pseudo-all-pass sample-and-hold circuit 300 is any circuit that provides a sample-and-hold function and has the transfer function:

$$Vout(s)/Vin(s)=K(s),\ K(s) \text{ is an all pass function when } Vin>Vout, \text{ and} \tag{4}$$

$$Vout(t) \text{ is a nearly constant signal when } Vin<Vout \tag{5}$$

Therefore, the pseudo-all-pass sample-and-hold configuration provides a sample-and-hold function in a regulator circuit without introducing a pole into the transfer function of the regulator. A regulator is then able to operate in a more stable manner.

In one embodiment, the pseudo-all-pass sample-and-hold circuit 300 is an active sample-and-hold device configured for all pass operation such as an integrated circuit, for example. In another embodiment, the pseudo-all-pass sample-and-hold circuit 300 is a passive circuit containing passive devices such as resistors, capacitors, diodes and the like.

A passive embodiment of a pseudo-all-pass sample-and-hold circuit 300 is discussed in detail with reference to FIG. 4.

Figure 1:
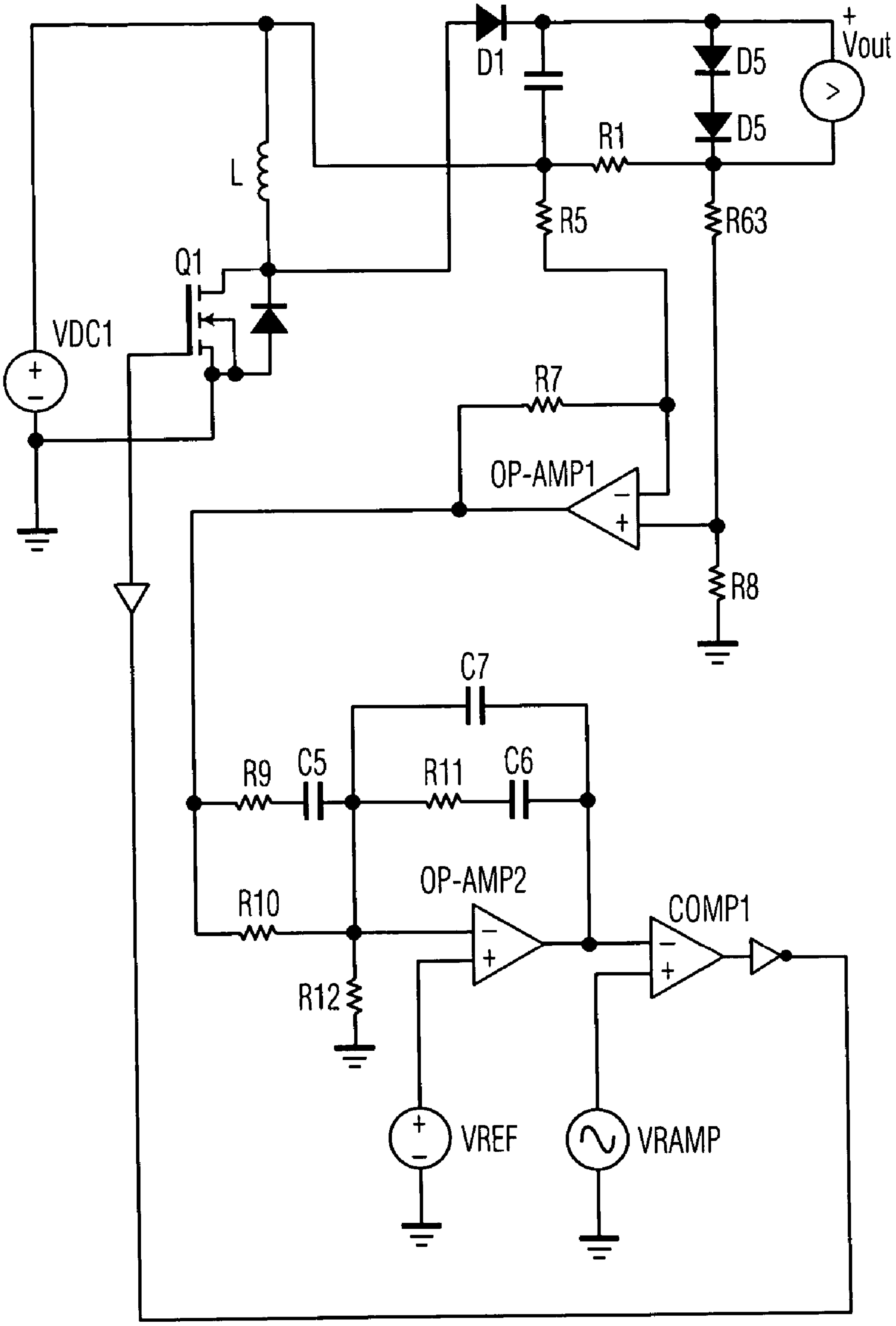
FIG. 1 PRIOR ART
FIG. 1 illustrates a prior art LED regulating system.
Figure 2:
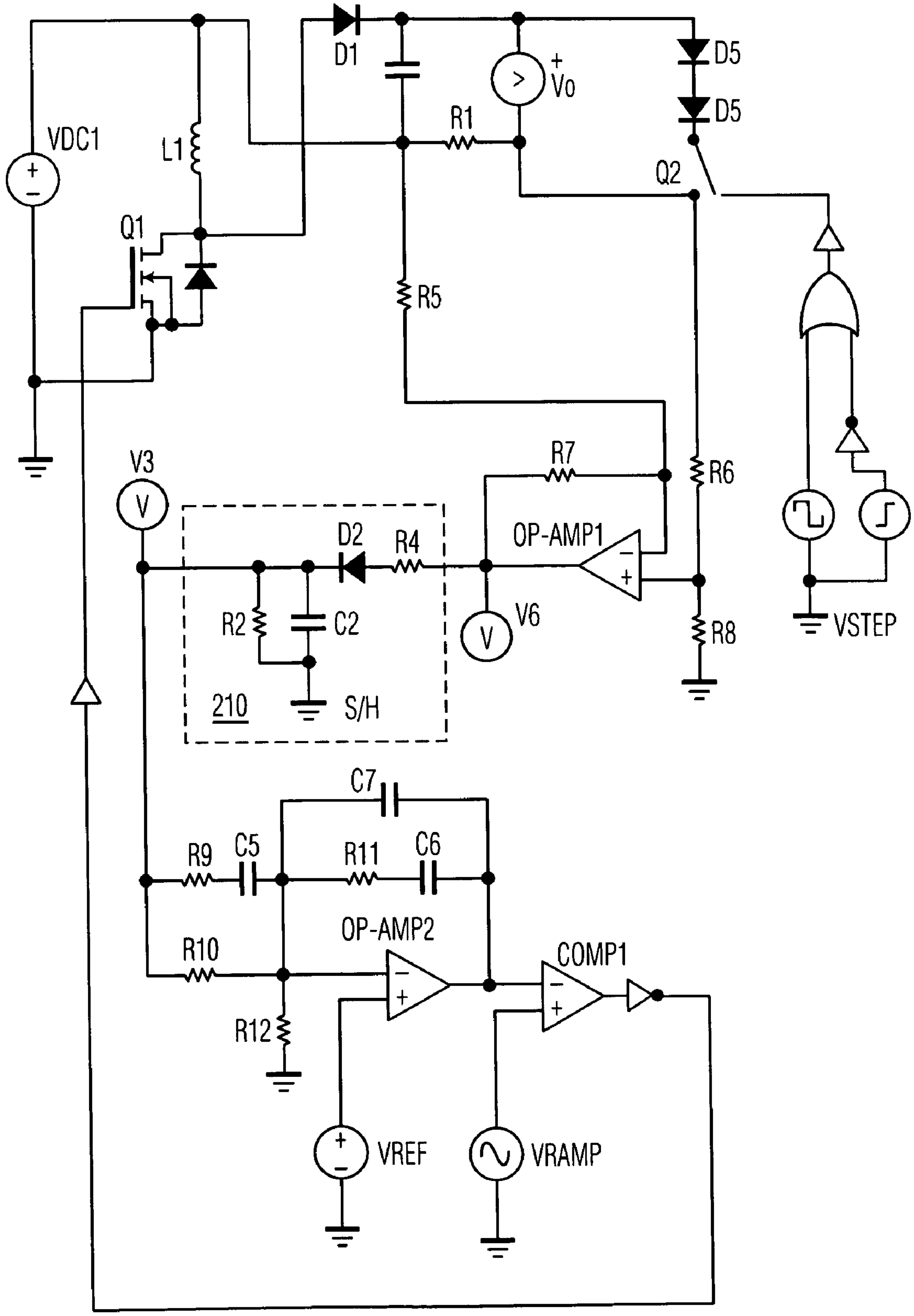
FIG. 2 PRIOR ART
FIG. 2 illustrates a prior art low-frequency PWM based LED regulating system.
Figure 4:
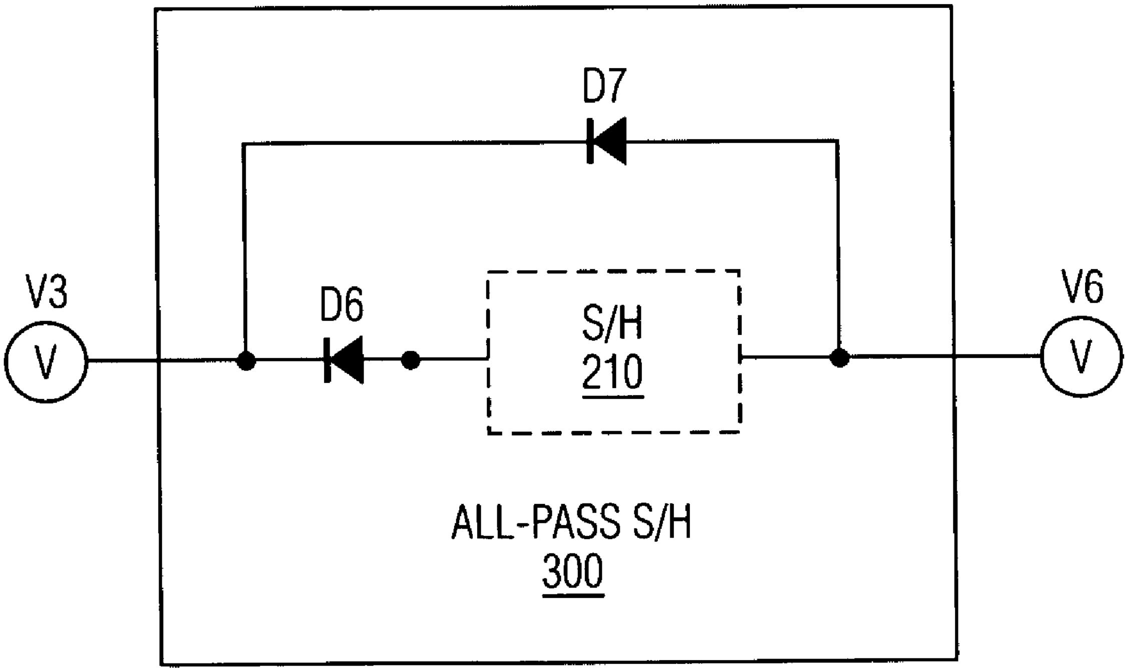
FIG. 4 is a block diagram illustrating an embodiment of the pseudo-all-pass sample-and hold circuit of FIG. 3 in accordance with the present invention.

FIG. 4 is a block diagram illustrating an embodiment of the pseudo-all-pass sample-and hold circuit of FIG. 3. FIG. 3, shows an all sample-and-hold circuit 300 comprising a sample and hold circuit 210 as in FIG. 2, a first pass diode D6 and a second pass diode D7. The first pass diode D6 is shown coupling the sample-and-hold circuit 210 to an output node V3 with a forward bias. The second pass diode D7 is shown coupling an input node V6 with the output node with a forward bias.

In operation, the pass diode D7 passes a current whenever the voltage potential at V6 is greater than the potential voltage at V3. The potential voltage applied to V6 is either time-varying, such as a periodic pulse or a DC value. The bias of diodes D6 and D7 prevents current reversal if the potential voltage of V3 is greater than V6, and therefore configures the sample-and-hold circuit.

In the following process description certain steps may be combined, performed simultaneously, or in a different order without departing from the invention.

Figure 5:
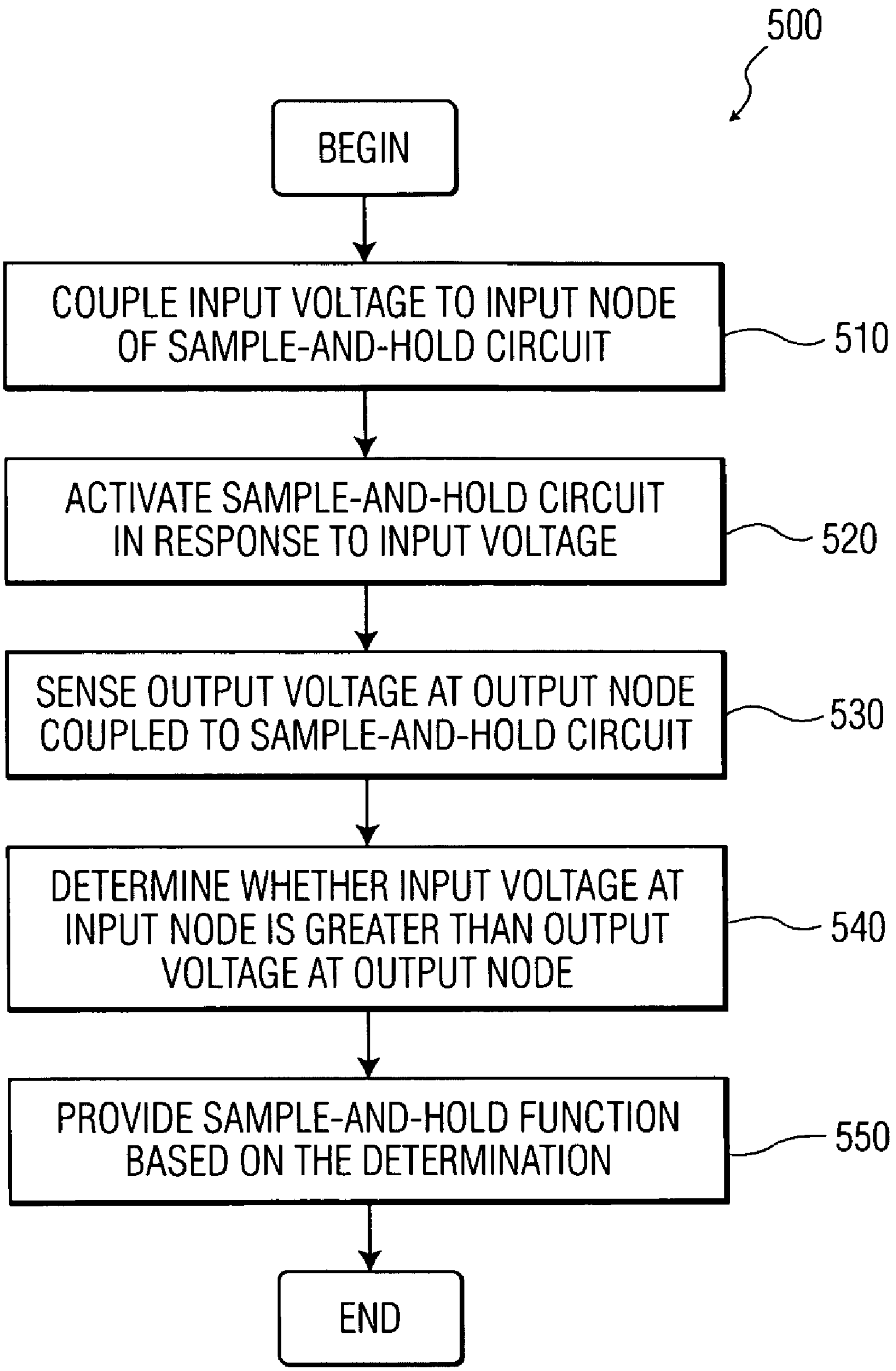
FIG. 5 is a flow diagram of a method for configuring a regulator circuit having a sample-and-hold circuit in accordance with the present invention.

FIG. 5 is a flow diagram of a method for configuring a regulator circuit having a sample-and-hold circuit in accordance with the present invention. Process 500 begins in step 510. Generally, the sample-and-hold circuit operates to reduce the current peak pulse in an LED string under PWM drive at each turn-on moment.

In step 510 an input voltage is coupled to an input node V6 of a pseudo-all-pass sample-and hold 300. The input voltage is generally the output of a regulator sub-circuit, such as, for example, a differential amplifier that monitors the current through an LED string D5. The input voltage may be a time-varying signal such as a periodic pulse, or a static DC value. The voltage may be coupled to the input node at any time, and may be selectably operated for specific functionality such as a PWM operational mode.

In step 520, the pseudo-all-pass sample-and-hold circuit 300 is activated in response to the voltage coupled in step 510. The pseudo-all-pass sample-and-hold circuit 300 contains components that are activated when a voltage is coupled to the circuit such as a capacitor. In one embodiment, the capacitor charges in response to the voltage signal. Activation of the sample-and-hold 300 occurs immediately with the coupling of the input voltage in step 510.

In step 530, output voltage at an output node is sensed. Generally, a first pass diode D6 and second pass diode D7 are configured around a sample-and-hold to allow sensing of the output voltage. The diodes will reverse bias if the output voltage is greater than the reference input voltage.

In step 540 a determination is made whether the input voltage at the input node is greater than the output voltage at the output node. Generally, the first pass diode D6 and the second pass diode D7 provide a determination of whether the input voltage is greater than the output voltage, since the forward biased diodes will conduct under those conditions. If the input voltage is less than the output voltage, then the diode D7 will not conduct and the output voltage of the sample-and-hold circuit will be an almost constant signal.

In step 550, a sample-and-hold function is provided based on the determination of step 540. The sample-and-hold circuit 300 has a transfer characteristic based on the relative voltages determined in step 540. The sample-and-hold function is provided at all times the sample-and-hold circuit is operational.

While the preferred embodiments of the invention have been shown and described, numerous variations and alternative embodiments will occur to those skilled in the art. Accordingly, it is intended that the invention be limited only in terms of the appended claims.

The invention claimed is:

1. A method for configuring a regulator circuit having a sample-and-hold circuit, comprising:

coupling an input voltage to an input node of the sample-and-hold circuit;

activating the sample-and hold circuit in response to the input voltage;

sensing an output voltage at an output node coupled to the sample and hold circuit;

determining whether the input voltage at the input node is greater than the output voltage at the output node; and providing a sample-and-hold function based on the determination.

2. The method of claim 1 wherein a transfer function of the sample-and-hold circuit is pseudo-all-pass if the input voltage at the input node is greater than an output voltage at the output node and is a substantially constant signal if the input voltage at the input node is less than the output voltage at the output node.

3. The method of claim 2 wherein the regulator circuit comprises a buck-boost converter, a differential amplifier, a PID controller, a sample-and-hold circuit and a PWM modulator.

4. The method of claim 2 wherein the sample-and-hold circuit is passive.

5. The method of claim 4 wherein the sample-and hold circuit comprises a series input resistor coupled to an input of a forward biased diode wherein the output of the diode is coupled to a capacitor in parallel with a resistor shunted to ground wherein the output of the sample-and-hold is taken from the output of the diode.

6. The method of claim 5 wherein providing the sample-and-hold circuit transfer function comprises arranging a second pass diode coupled between the input node and the output node and a first pass diode coupled between the sample-and-hold circuit and the output node.

7. The method of claim 6 wherein the first pass diode and the second pass diode are sensing the output voltage at the output node.

8. The method of claim 3 wherein coupling the input voltage to the sample-and-hold circuit comprises coupling the output of the differential amplifier wherein the differential amplifier is arranged to sense current through an LED.

9. The method of claim 2 wherein activating the sample-and hold circuit in response to the input voltage comprises energizing the sample-and-hold circuit with a voltage signal.

10. The method of claim 1 wherein the regulator circuit is capable of DC operation and low-frequency PWM current drive of LEDs.

11. A regulator circuit having a sample-and-hold circuit, comprising:

a regulation circuit;

a sample-and-hold circuit coupled to input and output nodes wherein the input node and output node are coupled to the regulation circuit; and wherein a transfer function of the sample-and-hold circuit is pseudo-all-pass if the input voltage at the input node is greater than an output voltage at the output node and is a substantially constant signal if the input voltage at the input node is less than the output voltage at the output node.

12. The regulator circuit of claim 11 wherein the sample and hold circuit further comprises a second pass diode coupled between the input node and the output node and a first pass diode coupled between the sample-and-hold circuit and the output node.

13. The regulator circuit of claim 12 wherein the regulation circuit is capable of DC operation and low-frequency PWM current drive of LEDs.

14. The regulator circuit of claim 12 wherein the regulation circuit comprises a buck-boost converter, a differential amplifier, a PID controller, a sample-and-hold circuit and a PWM modulator.

15. The regulator circuit of claim 14 wherein the sample-and-hold circuit is passive.

16. The regulator circuit of claim 15 wherein the sample-and hold circuit comprises a series input resistor coupled to an input of a forward biased diode wherein the output of the diode is coupled to a capacitor in parallel with a resistor both shunted to ground wherein the output of the sample-and-hold circuit is taken from the output of the diode.

17. The regulator circuit of claim 16 wherein the first pass diode and the second pass diode are forward biased from the input node to the output node.

18. A system for configuring a regulator circuit having a sample-and-hold circuit, comprising:

means for coupling an input voltage to an input node of the sample-and-hold circuit;

means for activating the sample-and hold circuit in response to the input voltage;

means for sensing an output voltage at an output node coupled to the sample and hold circuit;

means for determining whether the input voltage at the input node is greater than the output voltage at the output node; and means for providing a sample-and-hold function based on the determination.

* * * * *